(12) United States Patent
Yeh et al.

(10) Patent No.: US 11,334,703 B2
(45) Date of Patent: May 17, 2022

(54) INTEGRATED CIRCUIT LAYOUTS WITH FILL FEATURE SHAPES

(71) Applicant: Taiwan Semiconductor Manufacturing Co., Ltd., Hsinchu (TW)

(72) Inventors: Yu-Cheng Yeh, New Taipei (TW); Yen-Sen Wang, Hsinchu (TW); Ming-Yi Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 109 days.

(21) Appl. No.: 15/637,484

(22) Filed: Jun. 29, 2017

(65) Prior Publication Data

US 2019/0005180 A1 Jan. 3, 2019

(51) Int. Cl.
*G06F 30/392* (2020.01)
*G06F 30/398* (2020.01)
*H01L 27/02* (2006.01)
*G06F 30/394* (2020.01)

(52) U.S. Cl.
CPC .......... *G06F 30/392* (2020.01); *G06F 30/398* (2020.01); *H01L 27/0207* (2013.01); *G06F 30/394* (2020.01)

(58) Field of Classification Search
CPC .... G06F 30/392; G06F 30/394; G06F 30/398; H02L 27/0207; H02L 27/0611; H01L 21/76877
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2002/0024148 A1* | 2/2002 | Itoh .......................... | H01L 22/34 257/784 |

(Continued)

FOREIGN PATENT DOCUMENTS

WO    WO00/19490    4/2000

*Primary Examiner* — Jack Chiang
*Assistant Examiner* — Aric Lin
(74) *Attorney, Agent, or Firm* — Haynes and Boone, LLP

(57) ABSTRACT

Various examples of conductor features in integrated circuit layouts are disclosed herein. In an example, a method includes initializing a layout for fabricating an integrated circuit. A plurality of fill cells is inserted into the layout. The plurality of fill cells includes a plurality of fill line shapes that correspond to conductive lines of the integrated circuit. Thereafter, a design is inserted into the layout that includes a plurality of functional shapes. A conflicting subset of the plurality of fill line shapes of the plurality of fill cells that conflict with the plurality functional shapes are removed. The layout that includes the plurality of fill cells and the design is provided for fabricating the integrated circuit.

20 Claims, 12 Drawing Sheets

(56) References Cited

U.S. PATENT DOCUMENTS

| | | | |
|---|---|---|---|
| 2002/0104991 A1* | 8/2002 | Cleeves | C04B 35/44 257/48 |
| 2002/0185664 A1 | 12/2002 | Dixit et al. | |
| 2002/0199162 A1* | 12/2002 | Ramaswamy | G06F 17/5068 716/52 |
| 2004/0049754 A1* | 3/2004 | Liao | G06F 17/5068 716/120 |
| 2004/0188849 A1* | 9/2004 | Suga | H01L 23/528 257/773 |
| 2005/0062081 A1* | 3/2005 | Takami | H01L 21/3003 257/288 |
| 2008/0120586 A1* | 5/2008 | Hoerold | G06F 17/5068 716/52 |
| 2008/0163137 A1* | 7/2008 | Fiorenza | G06F 17/5009 716/111 |
| 2008/0164496 A1* | 7/2008 | Kawakami | H01L 23/5222 257/211 |
| 2009/0037864 A1 | 2/2009 | Becker et al. | |
| 2009/0055792 A1* | 2/2009 | Itagaki | G06F 17/5068 716/129 |
| 2009/0089732 A1 | 4/2009 | Van Adrichem et al. | |
| 2010/0270600 A1* | 10/2010 | Inukai | G06F 17/5031 257/288 |
| 2015/0115419 A1* | 4/2015 | Ma | H01L 23/5286 257/659 |
| 2016/0283631 A1 | 9/2016 | Lin et al. | |

\* cited by examiner

INTEGRATED CIRCUIT LAYOUTS WITH FILL FEATURE SHAPES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), planar FETs, Bipolar-Junction Transistors (BJTs), Light-Emitting Diodes (LEDs), memory devices, other active and/or passive devices, etc.). The interconnect structure may include any number of dielectric layers stacked vertically with conductive lines running horizontally within the layers. Vias may extend vertically to connect conductive lines in a layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
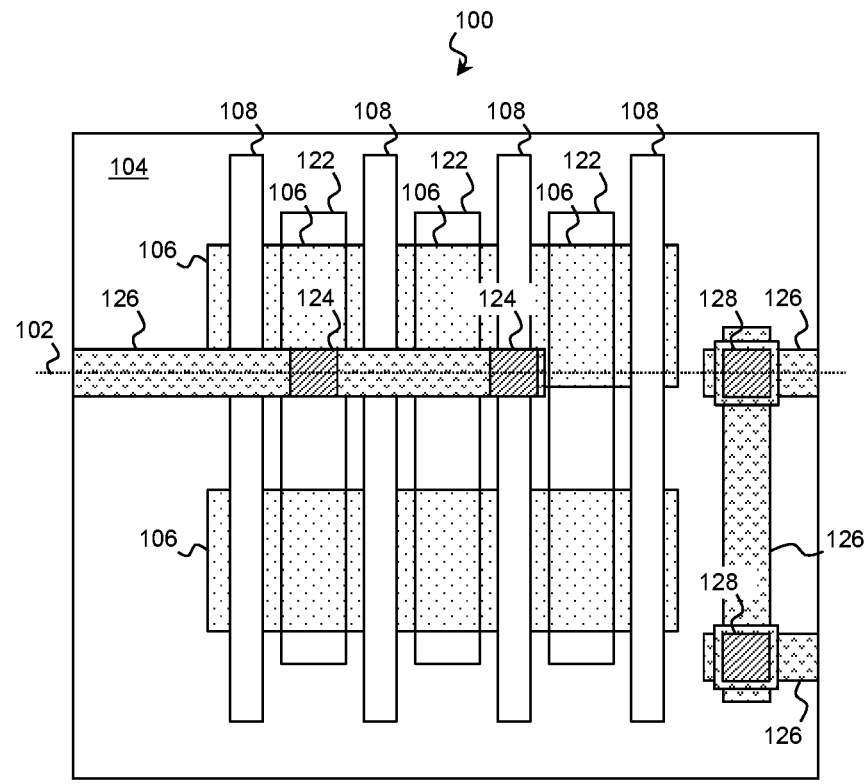
FIG. 1A is a top view of a portion of a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As device size shrinks, the final size of an integrated circuit may depend as much on the interconnect structure as on the circuit devices. However, the interconnect has generally resisted efforts to shrink it. While the thickness of the conductive lines of the interconnect may be reduced to pack more lines in a given area, thinner lines have proven challenging to reliably fabricate.

For example, it has been determined that interconnect layers with thinner lines may be more likely to have surface irregularities. One cause may be that, because of differences in hardness, regions of interconnect dielectric that are not reinforced by a certain amount of conductive lines may experience bumping or dishing even after a Chemical Mechanical Polishing/Planarization (CMP) process. As a result, the region has an irregular surface when the layer undergoes CMP. The irregular surface makes adding additional layers riskier because alignment errors due to layer variations tend to compound with each additional interconnect layer. As interconnect sizes shrink, the interconnect layers may become more sensitive to line density. Furthermore as interconnect sizes shrink, the effect of vias in reinforcing the dielectric becomes increasingly pronounced. However for smaller via sizes, vias that do not connect to a conductive line (i.e., isolated vias) tend to fabricate poorly and experience shrinkage, necking, and other etching and fill issues.

As described below, the present disclosure provides a technique for inserting additional conductive lines and vias into an interconnect structure in order to improve uniformity of the interconnect layer. The improved uniformity may improve the integrity of the interconnect structure and may enable additional layers to be added to the interconnect. In some examples, these fill lines and vias (which may also be referred to as dummy lines and vias) are added to regions of a layout that lack functional lines and vias. The fill lines and vias may be left floating or coupled to power or ground, but in contrast to their functional counterparts, they do not generally contribute to the operation of the circuit. In some such examples, the fill lines and vias are contained within fill cells, and each cell may structure the fill lines to properly overlap the fill vias so that the fill vias are not isolated.

In some examples, the fill cells may be inserted into a layout first and the functional design is laid over the fill cells. Fill lines and vias that conflict with the functional design may be removed to produce a layout for fabrication. The remaining fill features provide sufficient conductors to ensure that the final layout meets minimum line and minimum via densities and thereby ensure layer uniformity throughout. Because the fill cells provide fill lines that properly overlap the fill vias, isolated vias may be avoided.

In addition to vias and conductive lines, the interconnect may include contacts that extend vertically from a conductive line down to a semiconductor structure such as a raised device feature or the substrate upon which the interconnect is formed. Isolated contacts may experience many of the same fabrication issues as isolated vias. To address this, in some examples, the design is populated with fill cells that include sufficient Front-End Of Line (FEOL) features (e.g., raised device features, substrate features, and/or other semiconductor structures) and Back-End Of Line (BEOL) features (e.g., conductive lines) so that the fill contacts are not isolated. This may greatly improve uniformity of the lowest layers of the interconnect.

Thus, some embodiments of the present disclosure thereby provide greater interconnect structure uniformity. However, unless otherwise noted, no embodiment is required to provide any particular advantage.

Figure 1B:
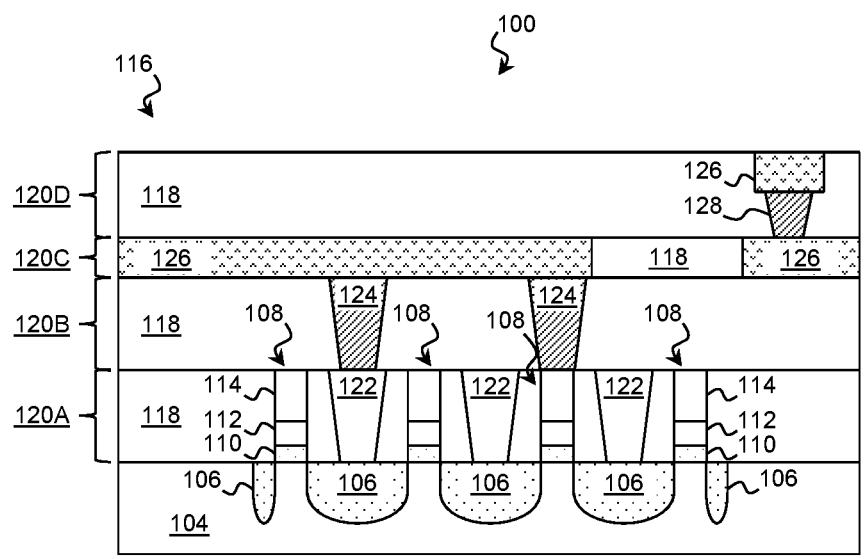
FIG. 1B is a cross sectional view of the workpiece according to various aspects of the present disclosure.

FIG. 1A is a top view of a portion of a workpiece 100 according to various aspects of the present disclosure. FIG. 1B is a cross sectional view of the workpiece 100 through line 102 according to various aspects of the present disclosure. FIGS. 1A and 1B have been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 104 with one or more integrated circuit devices formed upon it. In various examples, the substrate 104 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 104 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 104. In some such examples, a layer of the substrate 104 may include an insulator such as a semiconductor oxide, a semiconductor nitride, a semiconductor oxynitride, a semiconductor carbide, and/or other suitable insulator materials.

Various circuit features may be formed in and on the substrate 104. In some examples, the substrate 104 includes doped regions such as source/drain regions 106. In various examples, the source/drain regions 106 are doped with p-type dopants (P+), such as boron or $BF_2$, or n-type dopants (N+), such as phosphorus or arsenic. The source/drain regions 106 may be disposed in the substrate 104 in an example of a planar circuit device or may extend out of the substrate 104 in an example of a non-planar circuit device (e.g., a FinFET).

In some examples, the workpiece 100 includes gate stacks 108 disposed on the substrate 104 between the source/drain regions 106 to define a channel region therebetween. The flow of carriers (electrons for an n-channel device and holes for a p-channel device) through the channel region between the source/drain regions 106 is controlled by a voltage applied to the gate stack 108. Suitable gate stacks 108 include both polysilicon and metal gates.

The gate stacks 108 may include multiple layers, each of which may include one or more sub-layers. In an example, a gate stack 108 includes an interfacial layer 110 disposed on the substrate 104, a gate dielectric layer 112 disposed on the interfacial layer 110, and a gate electrode layer 114 disposed on the interfacial layer 110. The first layer, the interfacial layer 110, may include a metal silicate (e.g., HfSiO), a metal or semiconductor oxide, a metal or semiconductor nitride, a metal or semiconductor oxynitride, and/or other suitable material. Disposed on the interfacial layer 110 is the gate dielectric layer 112, which may be characterized by its dielectric constant relative to silicon dioxide. A high-k-type gate dielectric layer 112 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, (Ba,Sr)$TiO_3$ (BST), $Al_2O_3$, etc.), a metal silicate (e.g., HfSiO, LaSiO, AlSiO, etc.), a metal or semiconductor nitride, a metal or semiconductor oxynitride, combinations thereof, and/or other suitable materials. Finally, the gate electrode layer 114 may include layers of Ti, Ag, Al, TiAlN, TaC, TaCN, TaSiN, Mn, Zr, TiN, TaN, Ru, Mo, Al, WN, Cu, W, and/or any other suitable materials. In some examples, sidewall spacers are formed on one or more lateral surfaces of the gate stacks 108.

The workpiece 100 includes an interconnect structure 116 to electrically couple the circuit features such as the source/drain regions 106 and the gate stacks 108. The interconnect structure 116 includes a number of conductive features interspersed between layers of an Inter-Level Dielectric (ILD) 118. The ILD 118 may comprise any suitable dielectric material, such as a semiconductor oxide, a semiconductor nitride, a semiconductor oxynitride, a semiconductor carbide, TEOS oxide, PhosphoSilicate Glass (PSG), Boro-PhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SiLK® (a registered trademark of Dow Chemical, Midland, Mich.), polyimide, other suitable materials, and/or combinations thereof. The ILD 118 layers act to support and electrically isolate the conductive features.

At the lowest layer 120A of the interconnect structure 116, the ILD 118 may support and electrically isolate the gate stacks 108 as well as contacts that couple to substrate features, such as the Source/Drain (S/D) contacts 122 that extend to and electrically couple to the source/drain regions 106. Contacts, such as the S/D contacts 122, may include one or more layers of conductive materials including metals (e.g., Ti, Ta, W, Al, Ni, Cu, Co, etc.), metal nitrides, metal oxides, metal carbides, and/or other suitable materials. In an example, an S/D contact 122 includes adhesion layers of Ti and TiN disposed on the substrate 104 with a fill layer of W or Al disposed on the adhesion layers. The contacts in the lowest layer 120A may be formed concurrently with the gate stacks 108, and a CMP process used to planarize the lowest layer 120A may cause the top surface of these contacts (e.g., the S/D contacts 122) to be substantially coplanar with the top surface of the gate stacks 108.

The next layer 120B of the interconnect structure 116 may include mid-level contacts 124 within the ILD 118 that extend to and electrically couple to the S/D contacts 122 and to the gate stacks 108. As with the S/D contacts 122, these mid-level contacts 124 may include one or more layers of conductive materials including metals (e.g., Ti, Ta, W, Al, Ni, Cu, Co, etc.), metal nitrides, metal oxides, metal carbides, and/or other suitable materials. The mid-level contacts 124 in layer 120B may also electrically and physically couple to features of higher levels of the interconnect structure 116 such as the conductive lines 126 in layer 120C.

As can be seen, each layer 120 of the interconnect structure 116 may include contacts (e.g., S/D contacts 122, mid-level contacts 124), conductive lines 126, vias 128, or combinations thereof disposed within the ILD 118. For example, layer 120C includes conductive lines 126, while layer 120D includes conductive lines 126 and vias 128. The conductive lines 126 and vias 128 may include any suitable conductive material including metals (e.g., Ti, Ta, W, Al, Ni, Cu, Co, etc.), metal nitrides, metal oxides, metal carbides, and/or other suitable materials arranged in any number of layers. The conductive lines 126 and vias 128 may be formed separately or concurrently in a single- or dual-damascene process.

Because of structural differences between the ILD 118 and the conductive features (e.g., S/D contacts 122, mid-level contacts 124, conductive lines 126, vias 128, etc.), each layer of the interconnect structure 116 may include at least a minimum density of contacts 122/124, conductive lines 126, and vias 128 throughout the workpiece 100 to prevent surface irregularities when planarizing the layers. A technique for inserting fill features in a design used to produce a workpiece, such as the workpiece 100 of FIG. 1, is described with reference to FIGS. 2-7.

Figure 2:
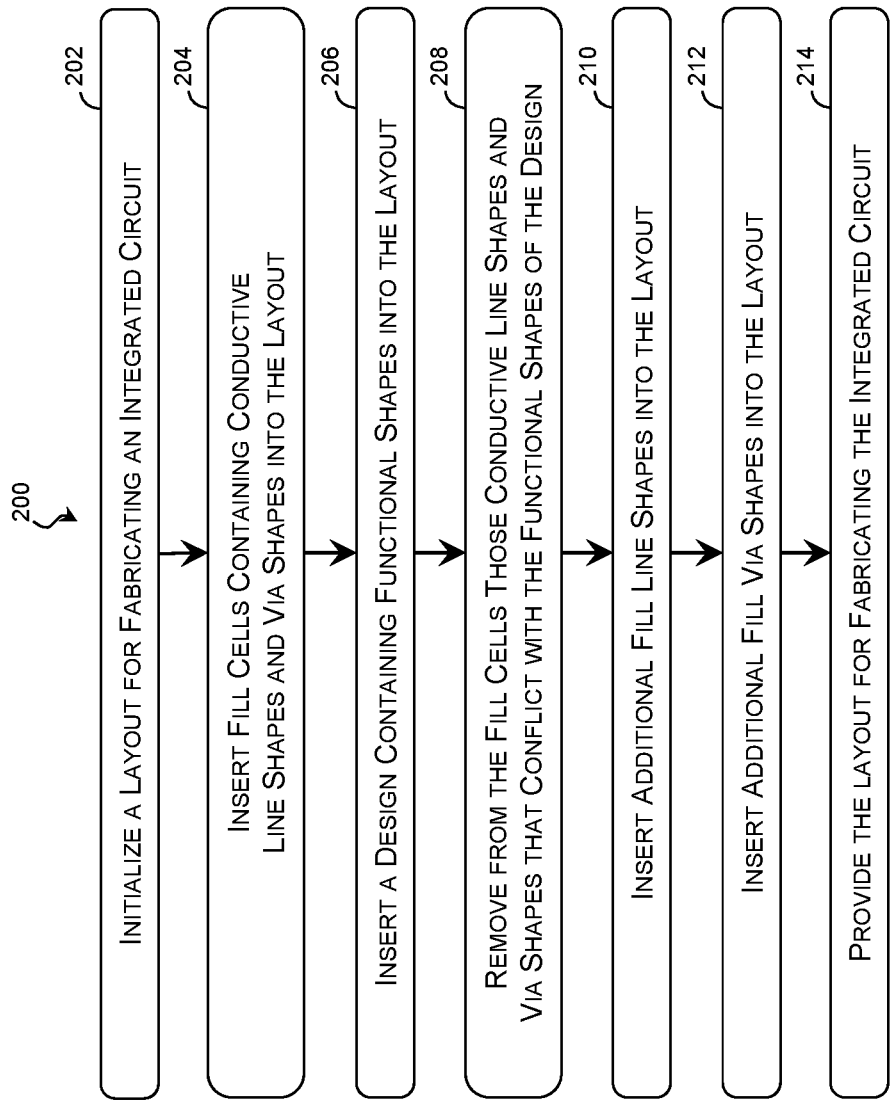
FIG. 2 is a flow diagram of a method of supplementing a layout with conductive feature shapes according to various aspects of the present disclosure.

FIG. 2 is a flow diagram of a method 200 of supplementing a layout 300 with conductive feature shapes according to various aspects of the present disclosure. Additional steps can be provided before, during, and after the method 200, and some of the steps described can be replaced or eliminated for other embodiments of the method 200. FIGS. 3-6 are top view diagrams of a portion of the layout 300 according to various aspects of the present disclosure. For clarity, only a limited number of layers in the layout 300 are illustrated, although in implementation, the layout 300 may include any number of suitable features in any number of layers.

Figure 3:
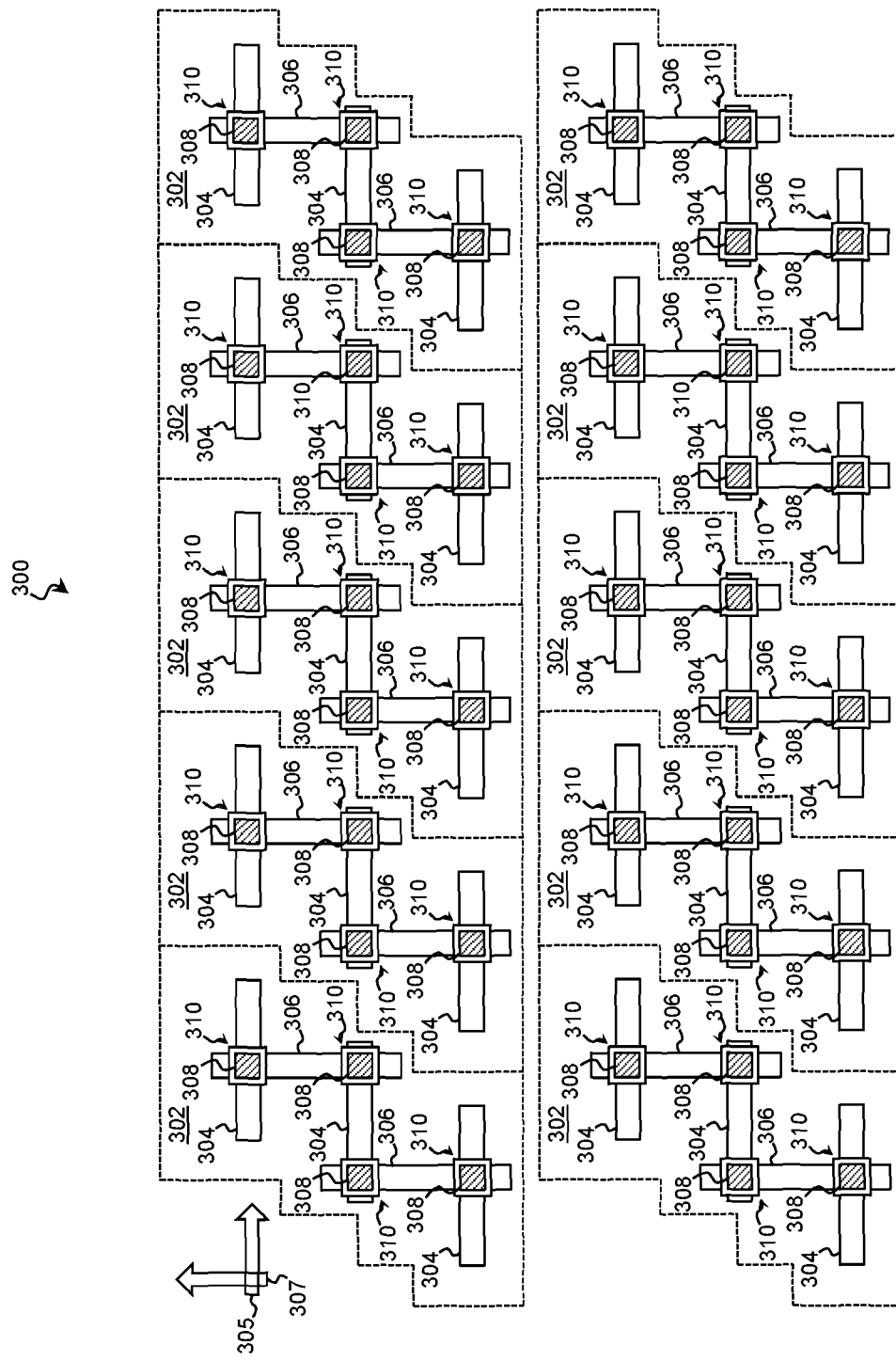
FIGS. 3-6 are top view diagrams of a portion of a layout according to various aspects of the present disclosure.

Referring to block 202 of FIG. 2 and referring to FIG. 3, the layout 300 is initialized. In various examples, the layout 300 takes the form of a data file stored on a non-transitory computer-readable medium and is represented in a design standard such as GDSII, OASIS, and/or MEBES®, a registered trademark of Applied Materials. The layout 300 may be a digital representation of an integrated circuit, and features of the layout 300 may correspond to and define physical features of the workpiece 100 of FIG. 1. For example, line shapes 304 and 306 in the layout 300 may correspond to the conductive lines 126 of FIG. 1, and via shapes 308 in the layout 300 may correspond to the vias 128 of FIG. 1.

Initializing the layout 300 may include defining the features and layers supported by the layout; defining rules governing size, spacing, and other aspects of the features; defining a boundary of the integrated circuit; and/or other initialization steps.

Because of differences in materials, regions of an ILD that are not reinforced by a certain amount of conductive features (e.g., conductive lines, contacts, vias, etc.) may experience bumping or dishing during a CMP process, which results in the region having an irregular surface. To reinforce the dielectric, fill cells 302 are inserted into the integrated circuit layout 300, as shown in block 204 of FIG. 2 and FIG. 3.

In some examples, the fill cells 302 include a first set of line shapes 304 in a first layer and extending in a first direction 305 and a second set of line shapes 306 in a second layer and extending in a second direction 307 perpendicular to the first. The fill cells 302 may also include via shapes 308 that extend between the line shapes 304 in the first layer and line shapes 306 in the second layer, and the line shapes 304 and 306 may have enlarged portions or pads 310 adjacent the via shapes 308 to promote proper via formation and connectivity.

In some examples, the fill cells 302 reinforce one or more layers of the ILD 118 and include sufficient conductive feature shapes on the respective layer(s) to meet a minimum line density, a minimum via density, and/or a minimum contact density throughout the layout 300. However for clarity, only a limited number of shapes on a limited number of layers are shown. Each layer may have a unique set of minimum densities based on dielectric materials, conductive feature materials, feature geometries, layer geometries, and/or other factors, and accordingly, the fill cells 302 may have different numbers and arrangements of shapes on each layer based on these factors. In some such examples, the fill cells 302 are configured to have conductive lines in a minimum of about 50% of the available line routing area (excludes area reserved to meet minimum line-to-line spacing) and vias/contacts in a minimum of about 6.25% of the available via/contact area (excludes area reserved to meet minimum spacing) as measured within an 80 nm-by-80 nm checking window. In further examples, the fill cells 302 are configured to exceed the minimum line densities, minimum via densities, and/or minimum contact densities for each layer by a guardband so that the layout 300 does not fall below a minimum if some fill cell shapes are removed.

The shapes of the fill cells 302, including the line shapes 304 and 306, via shapes 308, and/or any contact shapes, may be left floating or coupled to a voltage supply or ground. However, they are distinct from functional shapes in the same layers because they are not involved in the operation of the integrated circuit fabricated using the layout 300. Accordingly, the shapes of the fill cells 302 may have different sizes, spacing, and/or other aspects than the functional shapes, as explained in more detail below.

Figure 4:
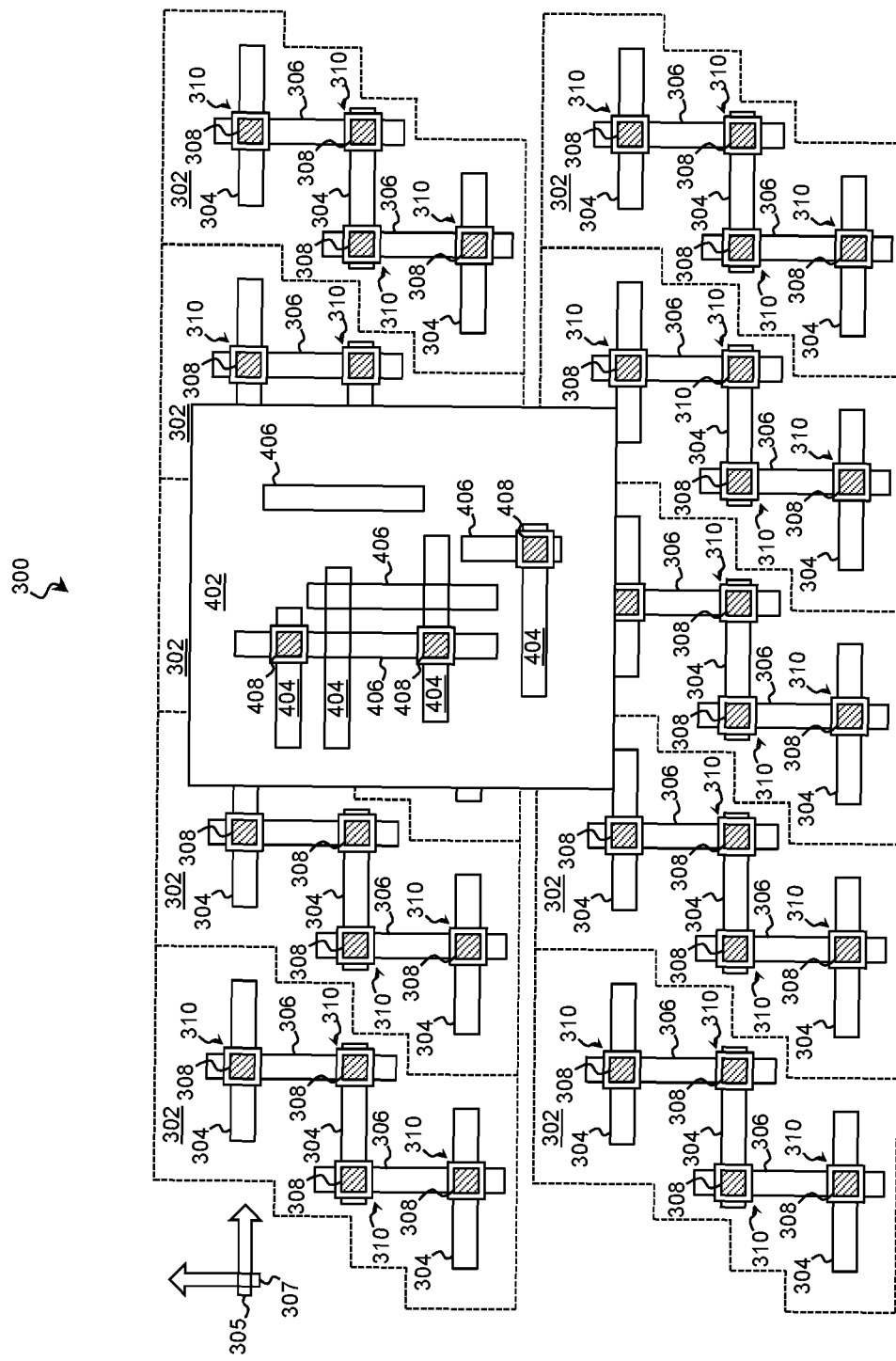

Referring to block 206 of FIG. 2 and to FIG. 4, a design 402 containing functional shapes is received and inserted into the layout 300. The design 402 may include any number of shapes on any number of interconnect structure layers, although for clarity, only a limited number of shapes on a limited number of layers are shown. In some examples, the design 402 includes a first set of functional line shapes 404 in the first layer and extending in the first direction 305 and a second set of functional line shapes 406 in the second layer and extending in the second direction 307. The design 402 may also include functional via shapes 408 that extend between the functional line shapes 404 in the first layer and the functional line shapes 406 in the second layer. The functional line shapes 404 and 406 may include enlarged portions or pads adjacent the functional via shapes 408 to promote proper via formation and connectivity. The functional shapes of the design 402 correspond to and define physical features of the workpiece 100 of FIG. 1 that are involved in the operation of the integrated circuit fabricated using the layout 300. For example, functional line shapes 404 and 406 in the layout 300 may correspond to the conductive lines 126 of FIG. 1, and functional via shapes 408 in the layout 300 may correspond to the vias 128 of FIG. 1.

Figure 5:
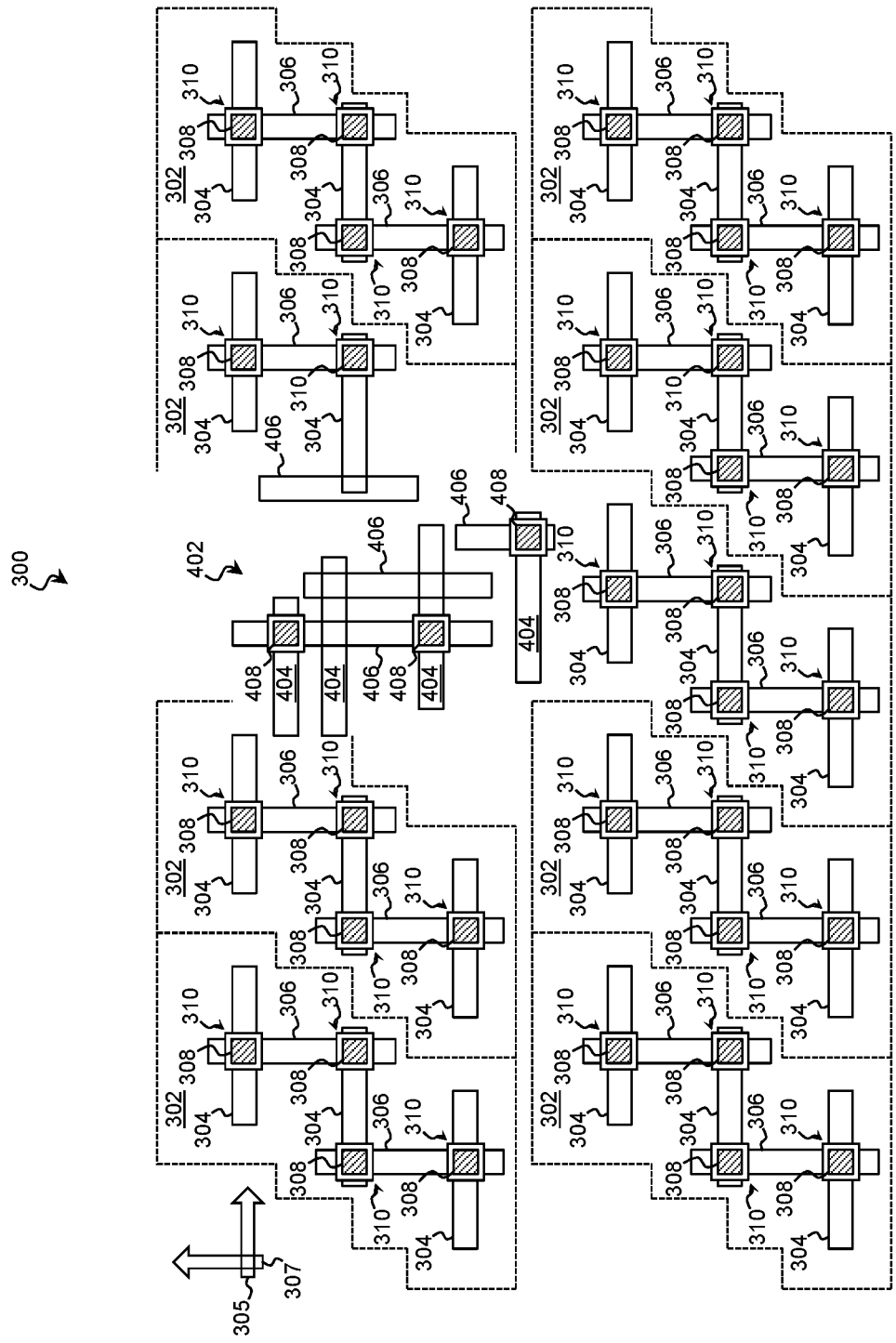

Referring to block 208 of FIG. 2 and to FIG. 5, shapes in the fill cells 302 (e.g., line shapes 304 and 306 and via shapes 308) that conflict with the shapes of the design 402 are removed. This may include removing individual shapes from a fill cell 302 while keeping others and/or removing fill cells 302 in their entirety. Fill shapes that overlap with functional shapes may be removed as well as those that are less than a minimum fill spacing distance from the functional shapes. The minimum fill spacing may be the same as or different from the minimum shape-to-shape spacing for the functional shapes of the design 402. Accordingly, in some examples where the minimum line-to-line spacing for functional line is on the order of 30 nm, the minimum fill spacing distance is a multiple thereof (e.g., 30 nm, 60 nm, 90 nm, etc.). Minimum fill spacing distances may vary based on the direction, and some examples, a layer has a first minimum fill spacing in the track direction (i.e., the direction in which the functional line shapes 404 extend in that layer) and a second minimum fill spacing between tracks (i.e., perpendicular to the track direction). Each layer of the interconnect may have its own set of minimum fill spacing distances.

Line shapes 304 and 306 may be removed completely or shortened to meet the minimum fill spacing distances. In some examples where a line shape is shortened, block 208 includes removing those via shapes 308 that no longer extend between the shortened line shapes or that are not sufficiently far from an end of a shortened line shape.

Figure 6:
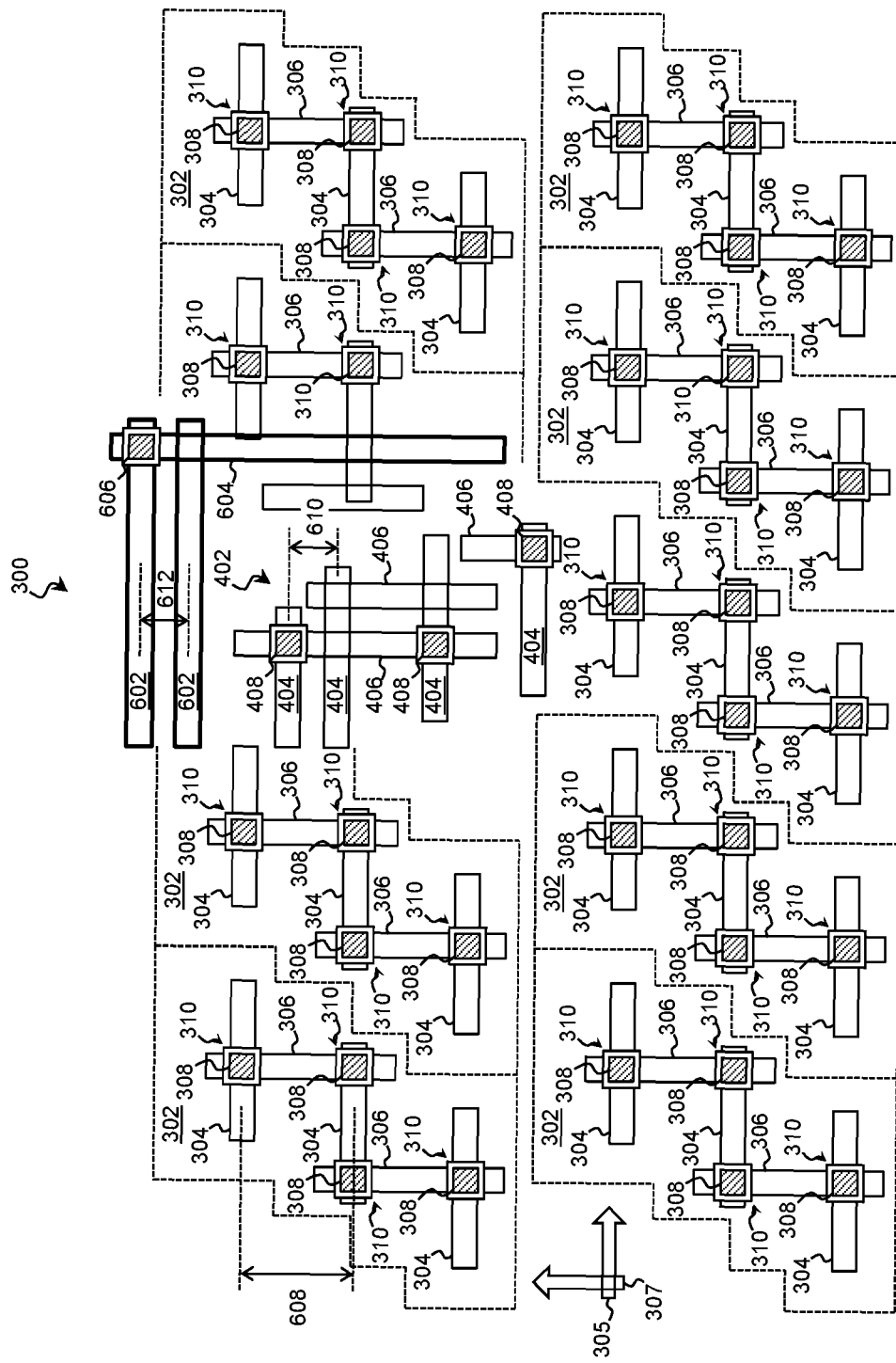

As noted above, in some examples, the minimum fill spacing distances for the purposes of block 208 are set to be greater than the minimum shape-to-shape spacing for the functional shapes of the design 402 (e.g., 2×, 3×, 4× the minimum shape-to-shape spacing for functional shapes). This permits a subsequent process to add additional fill features between the features of the fill cells 302 and the functional features of the design 402. Referring to block 210 and to FIG. 6, fill line shapes 602 are added to the first layer and fill line shapes 604 are added to the second layer. Referring to block 212 and referring still to FIG. 6, fill via shapes 606 are added where fill line shapes 602 and 604 overlap and where sufficient space exists from the line ends of the fill line shapes 602 and 604. As with the above shapes, these shapes also correspond to and define physical features of the integrated circuit. In that regard, fill line shapes 602 and 604 may correspond to the conductive lines 126 of FIG. 1, and fill via shapes 606 may correspond to the vias 128 of FIG. 1.

By removing shapes from the fill cells 302 and subsequently adding additional fill shapes, some examples of the method 600 provide higher fill shape density than using fill cells 302 alone. For example, in some examples, the line shapes 304 and 306 in the fill cells 302 are aligned at a centerline-to-centerline pitch 608 that is different from the pitch 610 of the functional line shapes 404 and 406 (and not an integer multiple thereof), and the tracks of the fill cell line shapes 304 and 306 are not aligned with the tracks of the functional line shapes 404 and 406. However, in these particular examples, the subsequently added line shapes 602 and 604 have the same pitch 612 and track alignment as the functional line shapes 404 and 406. This allows the line shapes 602 and 604 to be formed closer to the functional line shapes 404 and 406 than those of the fill cells 302.

After the processes of blocks 202-212, each layer of the layout 300 has sufficient shapes to meet a minimum line density (e.g., at least 50% of available line routing area), a minimum via density (e.g., at least 6.25% of the available via area), and/or a minimum contact density (e.g., at least 6.25% of the available contact area) and thereby promote integrity of the interconnect layers in which the shapes are to be formed. Referring to block 214 of FIG. 2, the layout 300 is provided for fabrication on a workpiece to form the integrated circuit specified by the layout 300. Fabrication may include any number of process steps including lithography, etching, deposition, epitaxy, annealing, CMP, cleaning, and/or other processes to produce a physical integrated circuit device.

While some of the above examples describe inserting fill cells 302 into the layout 300 prior to adding the design 402, additionally or in the alternative, fill cells may added to a layout after adding the design. Some such examples are described with reference to FIGS. 7-11.

Figure 7:
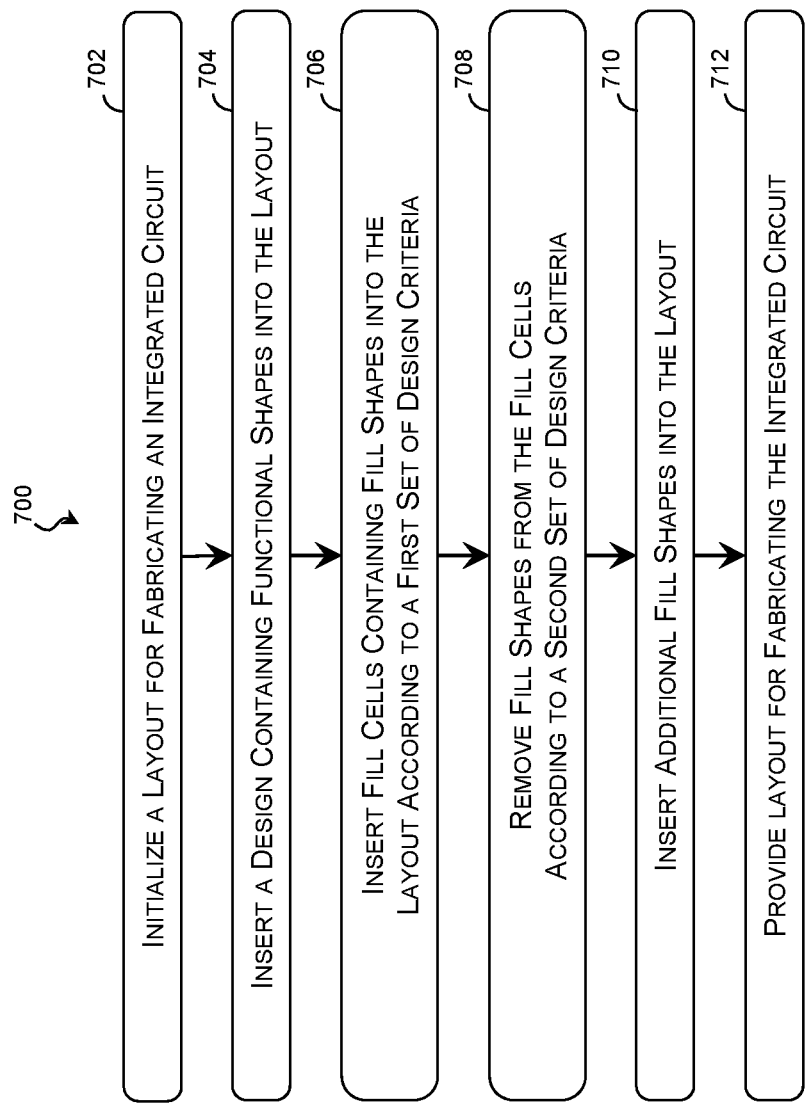
FIG. 7 is a flow diagram of a method of supplementing a layout with fill features according to various aspects of the present disclosure.

FIG. 7 is a flow diagram of a method 700 of supplementing a layout 800 with fill features according to various aspects of the present disclosure. Additional steps can be provided before, during, and after the method 700, and some of the steps described can be replaced or eliminated for other embodiments of the method 700. The method 700 may be performed as part of and concurrent with method 200 or as a discrete technique. FIGS. 8-11 are top view diagrams of a portion of the layout 800 being supplemented with fill features according to various aspects of the present disclosure. For clarity, only a limited number of layers in the layout 800 are illustrated, although in implementation, the layout 800 may include any number of suitable features in any number of layers. Whereas the layout 300 of FIGS. 3-6 illustrates two metal layers and a via layer therebetween, the layout 800 of FIGS. 8-11 illustrates device-level features, a metal layer, and contacts therebetween. However in some examples, layout 300 and layout 800 represent different layers of the same layout.

Figure 8:
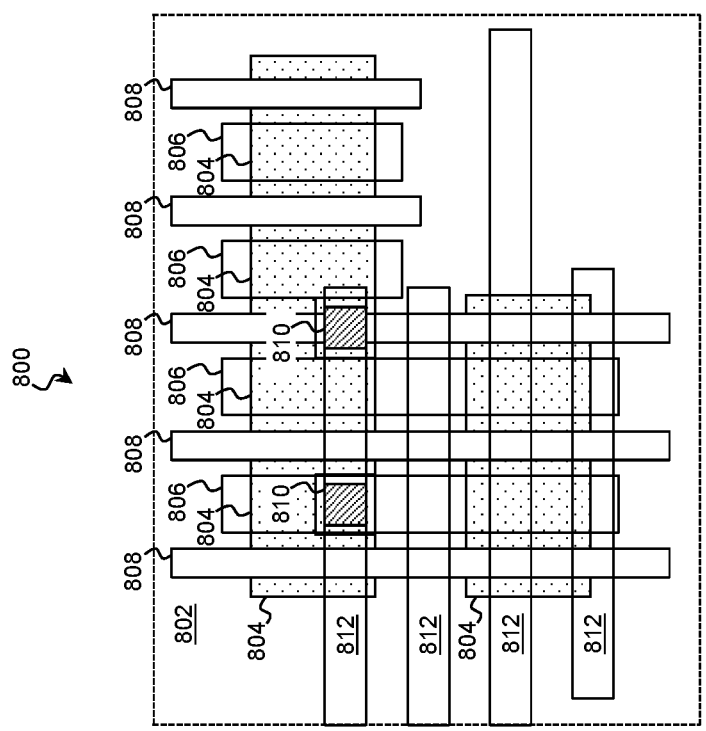
FIGS. 8-11 are top view diagrams of a portion of a layout being supplemented with fill features according to various aspects of the present disclosure.

Referring to block 702 of FIG. 7 and referring to FIG. 8, the layout 800 is initialized. This may be performed substantially as described in block 202 and the layout 800 may be substantially similar to layout 300, described above. In some examples, the layout 800 takes the form of a data file stored on a non-transitory computer-readable medium. The layout 800 may be a digital representation of an integrated circuit, and features of the layout 800 may correspond to and define physical features of the workpiece 100 of FIG. 1.

Referring to block 704 of FIG. 7 and referring still to FIG. 8, a design 802 containing functional shapes is received and inserted into the layout 800. The design 802 may be substantially similar to the design 402 above, although different layers are shown. The design 802 may include any number of shapes on any number of interconnect structure layers, although for clarity, only a limited number of shapes on a limited number of layers are shown. The shapes correspond to and define physical features. In various examples, the design 802 includes source/drain shapes 804 that define source/drain regions 106 of the integrated circuit, S/D contact shapes 806 that define S/D contacts 122, gate shapes 808 that define gate stacks 108, mid-level contact shapes 810 that define mid-level contacts 124, functional line shapes 812 that define conductive lines 126, and/or other shapes. The functional line shapes 812 may include enlarged portions or pads adjacent the mid-level contact shapes 810 to promote proper via formation and connectivity. These shapes may be grouped into Front-End Of Line (FEOL) shapes (e.g., source/drain shapes 804, gate shapes 808, S/D contact shapes 806, mid-level contact shapes, etc.) and Back-End Of Line (BEOL) shapes (e.g., line shapes 812).

Figure 9:
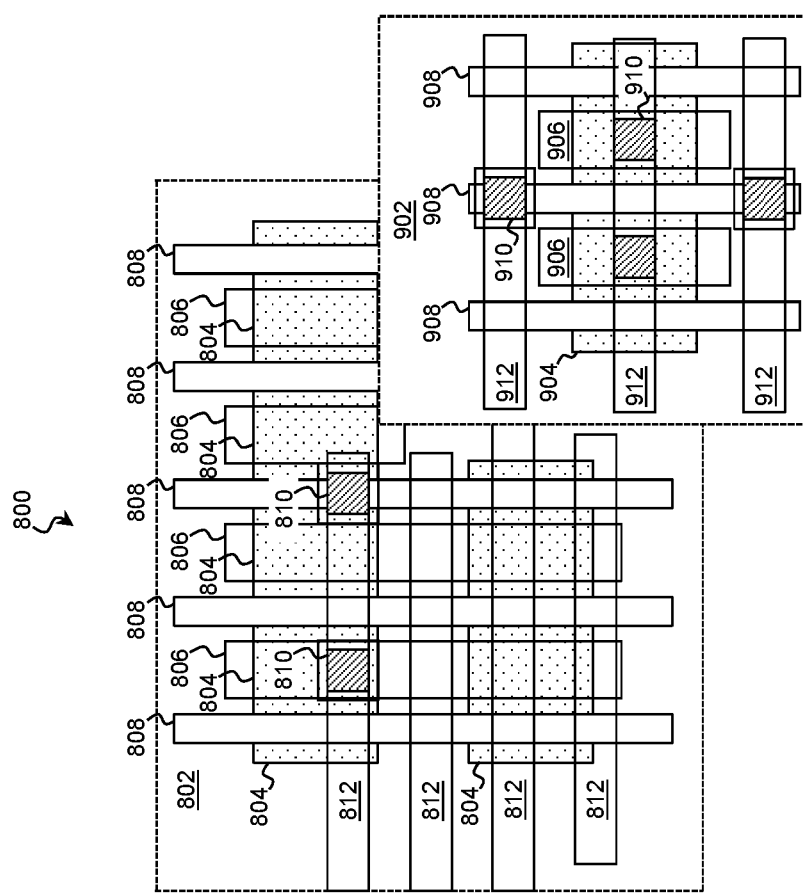
Figure 10:
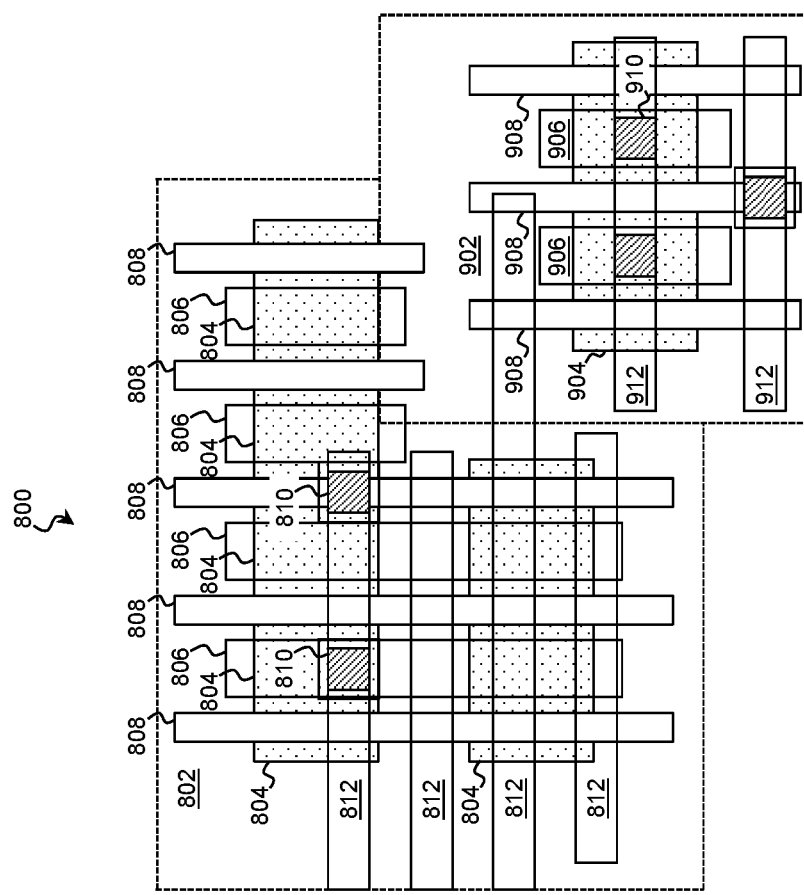

Referring to block 706 of FIG. 7 and to FIG. 9, fill cells 902 are inserted into the integrated circuit layout 800. The fill cells 902 may be substantially similar to the fill cells 302 above or may be distinct therefrom. The fill cells 902 may include shapes on any number of interconnect structure layers to provide a region of the layout 800 with sufficient conductive features to meet a minimum line density, a minimum via density, and/or a minimum contact density throughout the design. Each layer may have a unique set of minimum densities based on dielectric materials, conductive feature materials, feature geometries, layer geometries, and/or other factors, and accordingly, the fill cells 902 may have different numbers and arrangements of shapes on each layer based on these factors. In some examples, the fill cells 902 are configured to exceed the minimum line densities, minimum via densities, and/or minimum contact densities for each layer by a guardband so that the layout 800 does not fall below a minimum if some fill cell shapes are removed.

In various examples, the fill cells 902 include fill source/drain shapes 904 that define source/drain regions 106 of the integrated circuit, fill S/D contact shapes 906 that define and define S/D contacts 122, fill gate shapes 908 that define and define gate stacks 108, fill mid-level contact shapes 810 that define to mid-level contacts 124, fill line shapes 912 that define conductive lines 126 and/or other suitable shapes. The shapes of the fill cells 902 may be left floating or coupled to a voltage supply or ground. They are distinct from functional shapes in the same layers because they are not involved in the operation of the integrated circuit fabricated using the layout 800. Accordingly, the shapes of the fill cells 902 may have different sizes, spacing, and/or other aspects than the functional shapes.

The fill cells 902 may be placed according to a first set of design criteria, and in some examples, placement is determined by FEOL shape rules. In other words, the fill cells 902 are inserted in block 706 at locations where the FEOL shapes of the fill cells 902 do not overlap the FEOL shapes of the design 802 and are at least a minimum fill spacing distance from the FEOL shapes of the design 802. The minimum fill spacing may be the same as or different from the minimum shape-to-shape spacing for the functional shapes of the design 802. Accordingly, in some examples, the minimum fill spacing distance is a multiple of the minimum shape-to-shape spacing of the functional shapes. Minimum fill spacing distances may vary based on the direction, and some examples, a type of shape has a first minimum fill spacing in a first direction and a second minimum fill spacing in a second direction perpendicular to the first. Each type of shape may have its own set of minimum fill spacing distances.

Even though the placement of the fill cells 902 may comply with the first set of design criteria, the fill cells 902 may not comply with other criteria. Referring to block 708 of FIG. 7 and to FIG. 10, shapes are removed from the fill cells 902 according to a second set of design criteria, such as BEOL shape rules. In some such examples, BEOL shapes in the fill cells 902 that conflict with the BEOL shapes of the design 802 are removed. This may include removing individual shapes from a fill cell 902 while keeping others and/or removing fill cells 902 in their entirety. Fill shapes that overlap with functional shapes may be removed as well as those that are less than a minimum fill spacing distance from the functional shapes.

Figure 11:
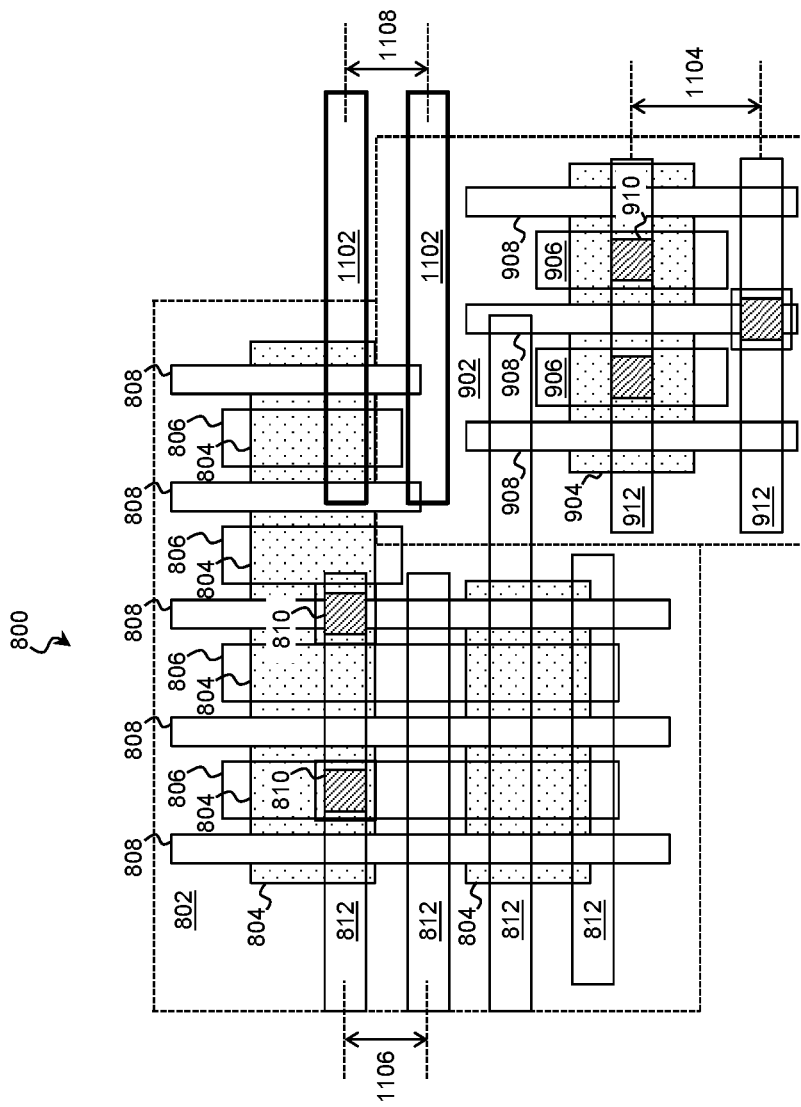

Referring to block 710 of FIG. 7 and to FIG. 11, additional fill shapes, such as fill line shapes 1102, are added to the layout 800. This may be performed substantially as described in block 210 of FIG. 6. The additional fill line shapes 1102 may provide higher fill shape density than fill cells 902 alone. For example, in some examples, the line shapes 912 in the fill cells 902 are aligned at a centerline-to-centerline pitch 1104 that is different from the pitch 1106 of the functional line shapes 812 (and not an integer multiple thereof), and the tracks of the fill cell line shapes 912 are not aligned with the tracks of the functional line shapes 812. However, in these particular examples, the subsequently added line shapes 1102 have the same pitch 1108 and track alignment as the functional line shapes 812. This allows the line shapes 1102 to be formed closer to the functional line shapes 812 than those of the fill cells 902.

After the processes of blocks 702-710, each layer of the layout 800 has sufficient shapes to meet a minimum line density (e.g., at least 50% of available line routing area), a minimum via density (e.g., at least 6.25% of the available via area), and/or a minimum contact density (e.g., at least 6.25% of the available contact area) and thereby promote integrity of the interconnect layers in which the shapes are to be formed. Referring to block 712 of FIG. 7, the layout 800 is provided for fabrication on a workpiece to form the specified integrated circuit. Fabrication may include any number of process steps including lithography, etching, deposition, epitaxy, annealing, CMP, cleaning, and/or other processes to produce a physical integrated circuit device.

Figure 12:
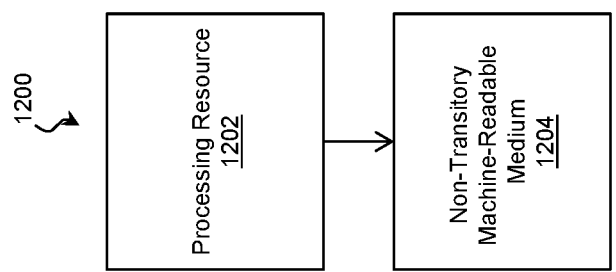
FIG. 12 is a block diagram of a computing system according to various aspects of the present disclosure.

In various embodiments, the technique is performed by using combinations of dedicated, fixed-function computing elements and programmable computing elements executing software instructions. Accordingly, it is understood that any of the steps of method 200 and/or method 700 may be implemented by a computing system using corresponding instructions stored on or in a non-transitory machine-readable medium accessible by the processing system. Examples of such a system and non-transitory machine-readable medium are described with reference to FIG. 12. In that regard, FIG. 12 is a block diagram of a computing system 1200 according to various aspects of the present disclosure.

The computing system 1200 includes a processing resource 1202 that, in turn, may include any number and type of processing elements such as Central Processing Units (CPUs) Graphical Processing Units (GPUs), Application-Specific Integrated Circuits (ASICs), microcontrollers, and/or other suitable processing elements. The processing resource 1202 is communicatively coupled to a tangible non-transitory machine-readable medium 1204 to execute instructions stored on the medium 1204. For the purposes of this description, the tangible non-transitory machine-readable medium 1204 can be any apparatus that can store the program for use by or in connection with the instruction execution system, apparatus, or device. The medium may include non-volatile memory including magnetic storage, solid-state storage, optical storage, cache memory, and/or battery-backed Random Access Memory (RAM).

In various examples, the tangible non-transitory machine-readable medium 1204 stores instructions that cause the processing resource 1202 to perform the processes of methods 200 and/or 700. In some such examples, the medium 1204 stores instructions that cause the processing resource 1202 to initialize a layout for fabricating an integrated circuit as described in block 202 of FIG. 2 and to insert fill cells containing conductive line shapes and via shapes into the layout substantially as described in block 204 of FIG. 2. In some such examples, the medium 1204 stores instructions that cause the processing resource 1202 to insert a design containing functional shapes into the layout substantially as described in block 206 of FIG. 2. In some such examples, the medium 1204 stores instructions that cause the processing resource 1202 to remove from the fill cells those conductive line shapes and via shapes that conflict with the functional shapes of the design substantially as described in block 208 of FIG. 2. In some such examples, the medium 1204 stores instructions that cause the processing resource 1202 to insert additional fill line shapes into the layout substantially as described in block 210 of FIG. 2 and to insert additional fill via shapes into the layout substantially as described in block 212 of FIG. 2. In some such examples, the medium 1204 stores instructions that cause the processing resource 1202 to provide the layout for fabricating the integrated circuit substantially as described in block 214 of FIG. 2.

In further examples, the medium 1204 stores instructions that cause the processing resource 1202 to initialize a layout for fabricating an integrated circuit substantially as described in block 702 of FIG. 7. In some such examples, the medium 1204 stores instructions that cause the processing resource 1202 to insert a design containing functional shapes into the layout substantially as described in block 704 of FIG. 7. In some such examples, the medium 1204 stores instructions that cause the processing resource 1202 to insert fill cells containing fill shapes into the layout according to a first set of design criteria substantially described in block 706 of FIG. 7. In some such examples, the medium 1204 stores instructions that cause the processing resource 1202 to remove fill shapes from the fill cells according to a second set of design criteria substantially described in block 708 of FIG. 7. In some such examples, the medium 1204 stores instructions that cause the processing resource 1202 to insert additional fill shapes into the layout substantially as described in block 710 of FIG. 7. In some such examples, the medium 1204 stores instructions that cause the processing resource 1202 to provide the layout for fabricating the integrated circuit substantially as described in block 712 of FIG. 7.

Thus, the present disclosure provides examples of a system and technique for adding conductive features to an integrated circuit to reinforce an interconnect structure. In some examples, a method includes initializing a layout for fabricating an integrated circuit. A plurality of fill cells are inserted into the layout, which include a plurality of fill line shapes that correspond to conductive lines of the integrated circuit. Thereafter, a design is inserted into the layout that includes a plurality of functional shapes, and a conflicting subset of the plurality of fill line shapes of the plurality of fill cells that conflict with the plurality of functional shapes are removed. The layout that includes the plurality of fill cells and the design is provided for fabricating the integrated circuit. In some such examples, the plurality of fill line shapes include a first set of line shapes that correspond to conductive lines in a first layer of an interconnect structure and a second set of line shapes that correspond to conductive lines in a second layer of the interconnect structure that is adjacent the first layer. In some such examples, the fill cells further include a plurality of fill via shapes extending between shapes of the first set of line shapes and shapes of the second set of line shapes. The plurality of fill via shapes corresponds to vias of the integrated circuit. In some such examples, the plurality of fill line shapes and the plurality of fill via shapes of the plurality of fill cells are such that layout that includes the plurality of fill cells and the design meets a metric from a group consisting of: a minimum conductive line density and a minimum via density. In some such examples, the plurality of fill line shapes of the plurality of fill cells is a first plurality of fill line shapes, and a second plurality of fill line shapes that correspond to conductive lines of the integrated circuit are inserted into the layout after the removing of the conflicting subset. In some such examples, the first plurality of fill line shapes have a centerline-to-centerline pitch that is different from the plurality of functional shapes, and the second plurality of fill line shapes in the plurality of functional shapes have a same centerline-to-centerline pitch. In some such examples, the first plurality of fill line shapes have a track alignment that is different from the plurality of functional shapes, and the second plurality of fill line shapes and the plurality of functional shapes have a same track alignment. In some such examples, the removing of the conflicting subset includes removing a first fill cell of the plurality of fill cells in its entirety and removing a shape from a second fill cell of the plurality of fill cells while leaving a remainder of the second fill cell. In some such examples, the removing of the conflicting subset includes removing a first-line shape of the plurality of fill line shapes that overlaps with a first functional shape of the plurality of functional shapes and removing a second line shape of the plurality of fill line shapes that is less than the minimum fill spacing from a second functional shape of the plurality of functional shapes. In some such examples, the minimum fill spacing includes an in-track minimum spacing and a between-track minimum spacing.

In further examples, a method includes receiving an integrated circuit layout and inserting fill cells into the integrated circuit layout. The fill cells include fill line shapes that define conductive lines of an integrated circuit and fill via shapes that define vias of the integrated circuit. After inserting the fill cells, a functional design is inserted into the integrated circuit layout. A subset of the fill line shapes that conflict with the functional design are removed, and a subset of the fill via shapes that conflict with the functional design are removed. Thereafter, the integrated circuit layout is provided for use in fabricating the integrated circuit. In some such examples, the fill line shapes include a first set of line shapes that define conductive lines in a first layer of an interconnect structure and a second set of line shapes that define conductive lines in a second layer the interconnect structure that is adjacent the first layer. In some such examples, the fill line shapes and the fill via shapes are such that the integrated circuit layout meets a metric from the group consisting of: a minimum conductive line density and a minimum via density. In some such examples, the fill line shapes are a first set of fill line shapes, and a second set of fill line shapes are inserted into the integrated circuit layout after the removing of the subset of the first set of fill line shapes that conflict with the functional design. In some such examples, the first set of fill line shapes have a pitch that is different from the functional design. In some such examples, the second set of fill line shapes and the functional design have a same pitch.

In further examples, a non-transitory machine-readable medium stores instructions that, when executed by processing resource, cause the processing resource to: initialize a layout for fabricating an integrated circuit; insert a design that includes a first set of Front-End Of Line (FEOL) shapes of the integrated circuit and a first set of Back-End Of Line (BEOL) shapes of the integrated circuit; insert fill cells in the layout, wherein the fill cells include a second set of FEOL shapes of the integrated circuit and a second set of BEOL shapes of the integrated circuit; remove a subset of the second set of BEOL shapes that conflict with the design; and provide the layout for fabrication of the integrated circuit. In some such examples, the fill cells are configured such that the layout with the subset of the second set of BEOL shapes removed meets a metric from a group consisting of: a minimum contact density, a minimum conductive line density, and a minimum via density. In some such examples, the fill cells are inserted such that the second set of FEOL shapes does not conflict with the design. In some such examples, the fill cells include contact shapes extending to a feature from a group consisting of: a source/drain shape and a gate stack shape.

In further examples, a method includes receiving an integrated circuit layout and inserting, into the integrated circuit layout, a design containing a first set of set of Front-End Of Line (FEOL) shapes of an integrated circuit and a first set of Back-End Of Line (BEOL) shapes of the integrated circuit. A set of cells are inserted into the integrated circuit layer containing a second set of FEOL shapes of the integrated circuit and a second set of BEOL shapes of the integrated circuit. The second set of BEOL shapes includes contact shapes that define contacts of the integrated circuit. A subset of the second set of BEOL shapes that conflict with the design are removed, and the layout that includes the design and the set of cells is provided for fabrication of the integrated circuit. In some such examples, the contact shapes define contacts to couple to source/drain regions of the integrated circuit and contacts to couple to gate stacks of the integrated circuit. In some such examples, the second set of BEOL shapes includes conductive line shapes that couple to the contact shapes. In some such examples, the removing of the subset of the second set of BEOL shapes includes removing a subset of the conductive lines shapes that are less than a minimum fill spacing distance from a shape of the design; and removing a subset of the contact shapes based on the removed subset of the conductive line shapes. In some such examples, the second set of FEOL shapes and the second set of BEOL shapes are such that the layout that includes the design and the set of cells meets a metric from a group consisting of: a minimum contact density, a minimum conductive line density, and a minimum via density. In some such examples, the second set of BEOL shapes has a centerline-to-centerline pitch that is different from the first set of BEOL shapes. In some such examples, the set of cells is inserted such that the second set of FEOL shapes does not conflict with the first set of FEOL shapes.

In further examples, a non-transitory machine-readable medium stores instructions that, when executed by a processing resource, cause the processing resource to: receive a layout for fabricating an integrated circuit; insert a design that includes Front-End Of Line (FEOL) shapes of the integrated circuit and Back-End Of Line (BEOL) shapes of the integrated circuit; insert fill cells in the layout. The fill cells include: source/drain shapes; source/drain contact shapes extending from the source/drain shapes; a first set of contacts extending from the source/drain contact shapes; gate stack shapes; a second set of contacts extending from the gate stack shapes; and conductive lines coupled to the first set of contacts and the second set of contacts. The instructions further cause the processing resource to: remove a subset of the conductive lines that conflict with the design; and provide the layout containing the design and the fill cells for fabrication of the integrated circuit.

In yet further examples, a non-transitory machine-readable medium stores instructions that, when executed by a processing resource, cause the processing resource to: initialize a layout for fabricating an integrated circuit; insert fill cells into the layout. The fill cells include a first plurality of fill line shapes that define conductive lines in a first layer of the integrated circuit. The instructions further cause the processing resource to: after the insertion of the fill cells, insert the functional design into the layout; remove a subset of the first plurality of fill line shapes that conflict with the functional design; insert a second plurality of fill line shapes into the layout that define conductive lines in the first layer of the integrated circuit; and provide the layout that includes the fill cells, the design, and the second plurality of fill line shapes for fabricating of the integrated circuit. In some such examples, the fill cells further include: a third plurality of fill line shapes that define conductive lines in a second layer of the integrated circuit that is adjacent the first layer and a plurality of fill via shapes that define vias of the integrated circuit and that extend between shapes of the first plurality of fill line shapes and shapes of the third plurality of fill line shapes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    initializing a layout for fabricating an integrated circuit;
    inserting a plurality of fill cells that represent conductive features in one or more inter-level dielectric (ILD) layers into the layout, wherein the plurality of fill cells includes a plurality of fill line shapes that correspond to metal lines of the integrated circuit;
    thereafter inserting a design that includes a plurality of functional shapes into the layout;
    removing a conflicting subset of the plurality of fill line shapes of the plurality of fill cells that conflict with the plurality of functional shapes;
    after the removing of the conflicting subset of the plurality of fill line shapes of the plurality of fill cells, adding new fill line shapes that represent conductive features in the one or more ILD layers to the layout that are closer to the functional shapes than the plurality of fill line shapes such that at least one of the plurality of fill line shapes overlaps at least one of the new fill line shapes and at least one of the plurality of functional shapes, wherein all added new fill line shapes are spaced apart from all functional shapes in a top view of the layout; and
    providing the layout that includes the plurality of fill cells, the new fill line shapes, and the design for fabricating the integrated circuit.

2. The method of claim 1, wherein the plurality of fill line shapes includes:
    a first set of line shapes that correspond to metal lines in a first layer of an interconnect structure; and
    a second set of line shapes that correspond to metal lines in a second layer of the interconnect structure that is adjacent the first layer.

3. The method of claim 2, wherein:
the fill cells further include a plurality of fill via shapes extending between shapes of the first set of line shapes and shapes of the second set of line shapes; and
the plurality of fill via shapes corresponds to vias of the integrated circuit.

4. The method of claim 1, wherein:
the plurality of fill line shapes has a centerline-to-centerline pitch that is different from the plurality of functional shapes; and
the new fill line shapes and the plurality of functional shapes have a same centerline-to-centerline pitch.

5. The method of claim 1, wherein:
the plurality of fill line shapes has a track alignment that is different from the plurality of functional shapes; and
the new fill line shapes and the plurality of functional shapes have a same track alignment.

6. The method of claim 1, wherein the removing of the conflicting subset includes:
removing a first fill cell of the plurality of fill cells in its entirety; and
removing a shape from a second fill cell of the plurality of fill cells while leaving a remainder of the second fill cell.

7. The method of claim 1, wherein the removing of the conflicting subset includes:
removing a first line shape of the plurality of fill line shapes that overlaps with a first functional shape of the plurality of functional shapes; and
removing a second line shape of the plurality of fill line shapes that is less than a minimum fill spacing distance from a second functional shape of the plurality of functional shapes.

8. The method of claim 7, wherein the minimum fill spacing includes an in-track minimum spacing and a between-track minimum spacing.

9. The method of claim 1, wherein another one of the plurality of fill line shapes within a same fill cell with the at least one of the plurality of fill line shapes also overlaps with the at least one of the new fill line shapes.

10. The method of claim 1, wherein the new fill line shapes and the plurality of functional shapes have a same track alignment.

11. A method comprising:
receiving an integrated circuit layout;
inserting fill cells into the integrated circuit layout, wherein the fill cells include fill line shapes that represent metal lines of an integrated circuit and fill via shapes that define vias of the integrated circuit;
after inserting the fill cells, inserting a functional design into the integrated circuit layout wherein the function design includes a plurality of functional shapes;
removing a subset of the fill line shapes that conflict with the functional design;
after the removing of the subset of the fill line shapes that conflict with the functional design, adding new fill line shapes to the layout that are closer to functional shapes of the functional design than the fill line shapes, wherein at least one of the fill line shapes within one of the fill cells overlaps one of the new fill line shapes and one of the functional shapes;
removing a subset of the fill via shapes that conflict with the functional design; and
thereafter, providing the integrated circuit layout for use in fabricating the integrated circuit.

12. The method of claim 11, wherein the fill line shapes include:
a first set of line shapes that define metal lines in a first layer of an interconnect structure; and
a second set of line shapes that define metal lines in a second layer of the interconnect structure that is adjacent the first layer.

13. The method of claim 11, wherein the fill line shapes have a pitch that is different from the functional shapes of the functional design.

14. The method of claim 13, wherein the new fill line shapes and the functional shapes of the functional design have a same pitch.

15. The method of claim 11, wherein the one of the new fill line shapes and the one of the functional shapes that both overlap with the at least one of the fill line shapes are parallel to each other.

16. The method of claim 11, wherein at least one of the new fill line shapes overlaps more than one of the fill line shapes.

17. A non-transitory machine-readable medium storing instructions that, when executed by a processing resource, cause the processing resource to:
initialize a layout for fabricating an integrated circuit;
insert a design that includes a first set of Front-End Of Line (FEOL) shapes of the integrated circuit and a first set of Back-End Of Line (BEOL) shapes of the integrated circuit;
insert fill cells in the layout, wherein the fill cells include a second set of FEOL shapes of the integrated circuit and a second set of BEOL shapes of the integrated circuit;
remove a subset of the second set of BEOL shapes that conflict with the design, while the second set of FEOL shapes remains;
after the removing of the subset of the second set of BEOL shapes that conflict with the design, adding new BEOL shapes such that the new BEOL shapes overlap at least one of the first set of BEOL shapes of the design; and
provide the layout for fabrication of the integrated circuit.

18. The non-transitory machine readable medium of claim 17, wherein the fill cells are configured such that the layout with the subset of the second set of BEOL shapes removed meets a metric from a group consisting of: a minimum contact density, a minimum conductive line density, and a minimum via density.

19. The non-transitory machine readable medium of claim 17, wherein the fill cells are inserted such that the second set of FEOL shapes does not conflict with the design.

20. The non-transitory machine readable medium of claim 19, wherein the fill cells include contact shapes extending to a feature from a group consisting of: a source/drain shape and a gate stack shape.

* * * * *